United States Patent
Houldsworth

(10) Patent No.: US 7,248,053 B2
(45) Date of Patent: Jul. 24, 2007

(54) ONE TIME OPERATING STATE DETECTING METHOD AND APPARATUS

(75) Inventor: John Houldsworth, Reston, VA (US)

(73) Assignee: Powerprecise Solutions, Inc., Herndon, VA (US)

( * ) Notice: Subject to any disclaimer, the term of this patent is extended or adjusted under 35 U.S.C. 154(b) by 0 days.

(21) Appl. No.: 11/181,841

(22) Filed: Jul. 15, 2005

(65) Prior Publication Data

US 2006/0012333 A1    Jan. 19, 2006

Related U.S. Application Data

(60) Provisional application No. 60/588,289, filed on Jul. 15, 2004.

(51) Int. Cl.
*G01N 27/416* (2006.01)
*H02J 1/00* (2006.01)

(52) U.S. Cl. .................... 324/426; 320/106

(58) Field of Classification Search ............. 324/421, 324/426, 427, 538; 320/107
See application file for complete search history.

(56) References Cited

U.S. PATENT DOCUMENTS

| | | | |
|---|---|---|---|
| 3,711,770 A | 1/1973 | Wilson | |
| 4,207,514 A | 6/1980 | Klein | |
| 4,539,516 A * | 9/1985 | Thompson | 320/101 |
| 4,710,720 A * | 12/1987 | Weiner | 324/550 |
| 4,987,372 A | 1/1991 | Ofori-Tenkorang et al. | |
| 5,221,888 A | 6/1993 | Moody | |
| 5,349,282 A | 9/1994 | McClure | |
| 5,372,898 A | 12/1994 | Atwater et al. | |
| 5,444,378 A * | 8/1995 | Rogers | 324/428 |
| 5,659,240 A * | 8/1997 | King | 320/134 |
| 5,661,042 A * | 8/1997 | Fang et al. | 438/17 |
| 6,014,141 A | 1/2000 | Klein | |
| 6,097,193 A * | 8/2000 | Bramwell | 324/429 |
| 6,195,613 B1 * | 2/2001 | Roy et al. | 702/65 |
| 6,396,298 B1 | 5/2002 | Young et al. | |
| 6,549,014 B1 * | 4/2003 | Kutkut et al. | 324/426 |
| 6,967,483 B2 * | 11/2005 | Kwark | 324/421 |

* cited by examiner

*Primary Examiner*—Anjan Deb
(74) *Attorney, Agent, or Firm*—DLA Piper US LLP

(57) ABSTRACT

A method and apparatus for detecting a change in an electrical property between contacts. A one-time operating state detection device includes a member coupling a pair of contacts and a detector for detecting a change in the coupling between the pair of contacts when the member is removed.

33 Claims, 4 Drawing Sheets

ONE TIME OPERATING STATE DETECTING METHOD AND APPARATUS

CROSS-REFERENCE TO RELATED APPLICATIONS

This application is related to and claims priority from provisional patent application Ser. No. 60/588,289 filed Jul. 15, 2004, the entire disclosure of which is incorporated by reference herein.

FIELD OF THE INVENTION

The invention relates generally to a one-time operating method and apparatus for detecting a change in state.

BRIEF DESCRIPTION OF THE DRAWINGS

A more complete appreciation of the various embodiments will be readily obtained by reference to the following detailed description when considered in conjunction with the accompanying drawings, wherein.

DETAILED DESCRIPTION OF SEVERAL EMBODIMENTS

Embodiments of the invention include one-time operating apparatuses, systems and methods for detecting a change in state. The invention can be used to activate or deactivate any circuitry by changing from a first operating state to a second operating state in response to a change in an electrical property between contacts. For example, the invention can activate or deactivate a battery management function. Such battery management function can, for example, be to completely discharge a battery pack prior to disposal. Alternatively, the invention can be used to activate or deactivate a state-of-charge indicator. Other applications include, for example, implementing a security seal on the enabling of a function or device to indicate whether a device was ever put into service; enabling a battery operated device after a potentially long shelf life; activation of an emergency beacon; automatic activation on physically opening a device; or an acceleration/deceleration sensor in which a mass is attached to the member to detect crash, impact or bump. Of course, the invention has numerous other applications as would be known to those skilled in the art. It should be understood that the apparatuses and methods described herein may be implemented by any combination of hardware, software and/or firmware.

Various embodiments for implementing a battery pack discharge function will be described in more detail below. As used herein, the term "battery pack" may represent any power source that may be employed to power a load. For example, a battery pack may be utilized to power such devices as, without limitation, a processor; a microprocessor; a personal computer, such as a laptop, palm PC, desktop or workstation; an electronic wired or wireless device, such as, for example, a telephone or electronic transceiver box; a cellular telephone; a personal digital assistant; an electronic pager and digital watch. In various embodiments, the battery pack may comprise, but is not limited to, a lithium, lithium-ion, $LiSO_2$, nickel-metal hydride (NiMH) and/or nickel-cadmium (NiCad) battery pack.

Figure 1:
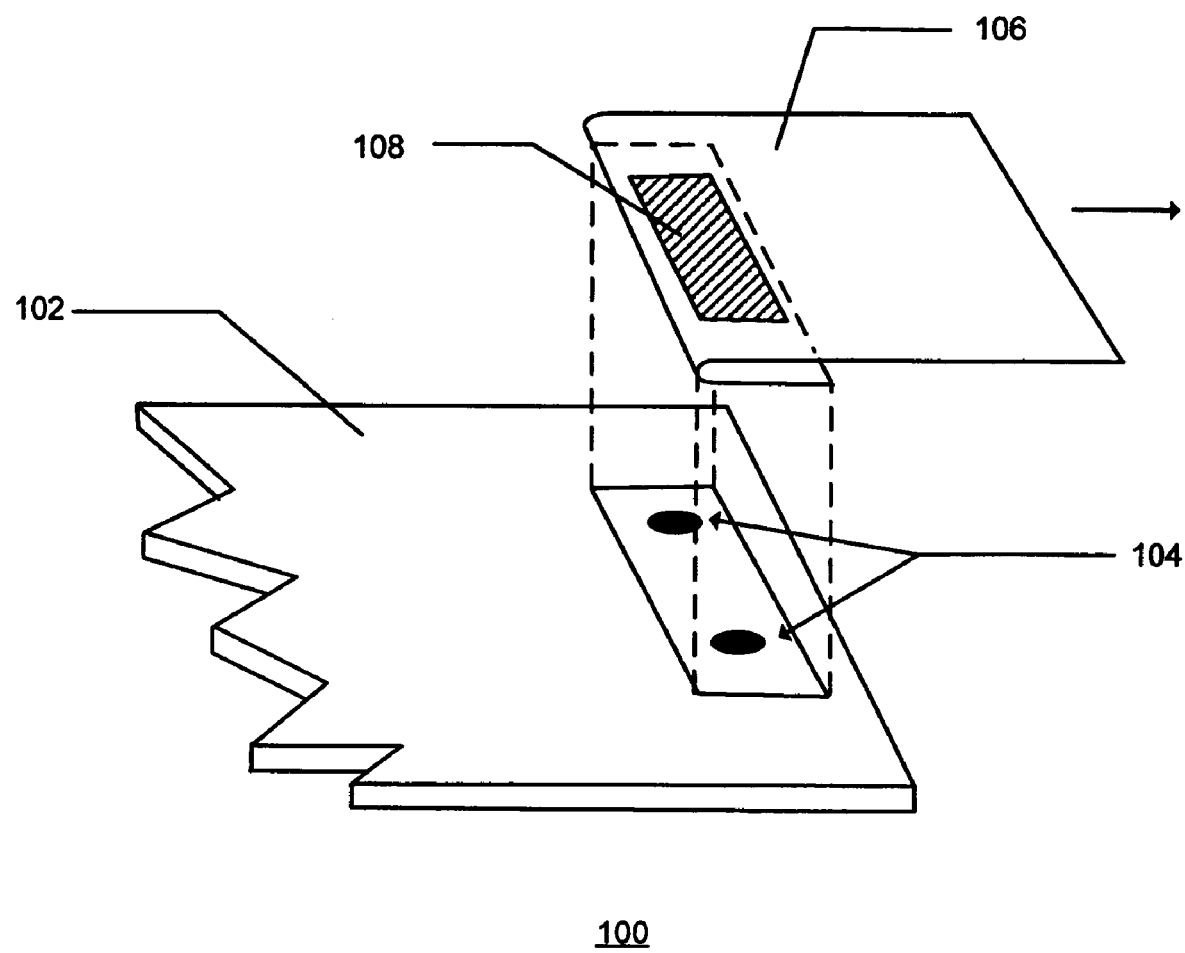
FIG. 1 illustrates a member for changing an electrical property between contacts according to embodiments of the invention.

FIG. 1 illustrates a one-time operating member for changing an electrical property between contacts according to various embodiments. The detection device 100 includes a printed circuit board 102 having a pair of electrical contacts 104. In various embodiments, the printed circuit board 102 can be integrated into a battery casing or can be housed separately from the battery casing. The electrical contacts 104 can be located on a front side of the printed circuit board 102 with various mounted components. Alternatively, the contacts 104 may be located on a back side of the printed circuit board 102 without mounted components so that additional printed circuit board area is not required for the implementation of the detection device.

A one-time removable member 106 comprising a conductive layer 108 is initially coupled to the contacts 104 to form a conductive coupling. For various applications, the member 106 is one-time removable to ensure activation (and to prevent deactivation) of a desired function, such as the complete discharge of a battery pack prior to disposal.

In one embodiment, the one-time removable member 106 may comprise a flexible tape or ribbon. For example, the member 106 may be formed from any material of suitable integrity, such as mylar, kapton or the like, such that the member 106 may completely separate from the contacts 104 when desired. The conductive layer 108 may comprise any material suitable for electrical conduction, such as, for example, gold, copper, platinum or the like and may cover a portion of the surface area of the member 106, as shown. Alternatively, the conductive layer 108 may cover the entire surface area of the member 106.

The one-time removable member 106 may be coupled to the printed circuit board 102 so that the conductive layer 108 may conductively couple the contacts 104 by any variety of methods. For example, the conductive layer 108 of the member 106 may be coupled to the contacts 104 via reflow soldering, using a conductive adhesive, or by any other suitable technique that is compatible with printed circuit board surface mount assembly techniques (referred to herein as "a bond". The bond is in a first state, when the member 106 is coupled to the contacts 104. The remainder of the one-time removable member 106 that is not in contact with the contact 104 and/or the printed circuit board 102 is configured to fold back over the portion of the member 104 that includes the conductive layer 108. Removing the folded portion of the member 106 in the indicated direction causes the portion of the member 106 that includes the conductive layer 108 to decouple from the printed circuit board 102, terminating the conductive coupling between the conductive layer 108 and the contacts 104. "One-time removable" is defined herein as the bond achieving a second state in which the bond is physically configured such that the one-time removable member cannot be reattached to the contacts 104.

In one embodiment, the printed circuit board 102 additionally comprises a detector such as, for example, an electronic circuit for detecting the conductive coupling between the member 106 and the contacts 104. When the detector detects a change in the coupling between the contacts 104, the detector may, for example, selectively operate a battery management function. In various embodiments, the battery management function may comprise, for example, a battery discharge operation or a state-of-charge indication. Alternatively, the battery management function may comprise a plurality of such functions.

Figure 2A:
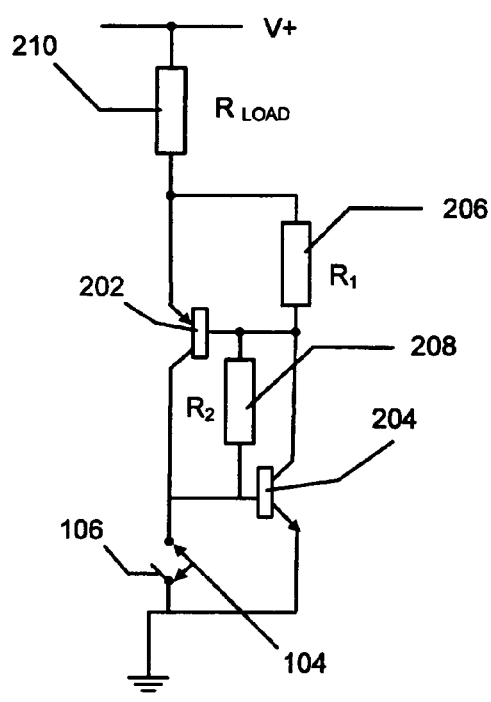
FIG. 2A illustrates a circuit diagram of a state detection device according to embodiments of the invention.

FIG. 2A illustrates a detection device according to various embodiments. In one embodiment, the detection device comprises a discrete transistor latch circuit 200 that includes upper and lower bi-polar transistors, 202 and 204 respectively, resistors R1 and R2, 206 and 208 respectively, the one-time removable member 106 of FIG. 1 represented as a switch and a load resistor 210 connected to a battery pack. The latch circuit 200 may be armed for discharging the battery pack by removing the one-time removable member 106 to break the conductive coupling between the member 106 and the electrical contacts 104.

In operation, the transistors 202 and 204 are arranged to provide a feedback loop. The one-time removable member 106 conductively couples the base and the emitter of the lower transistor 204 to ensure that the "latch" is maintained in a first "reset" state. As such, the base to emitter voltage, or $V_{BE}$, of the lower transistor 204 is about 0 in the first mode, maintaining transistor 204 in a nonconductive state. The values of resistors R1 206 and R2 208 are selected to maintain transistor 202 nonconductive. When the member 106 is removed from being electrically coupled with the contacts 104, the latch circuit 200 is armed such that it may be triggered to change from the first reset state to a second "latched" or active state by a relatively small current into the base of transistor 204. For example, a triggering current may be provided via resistor R2 208. This causes transistor 204 to conduct, which, in turn, causes transistor 202 to conduct. In the second latched or active state, the main current through the load resistor 210 will flow through transistors 202 and 204 to begin the discharge operation.

Figure 2B:
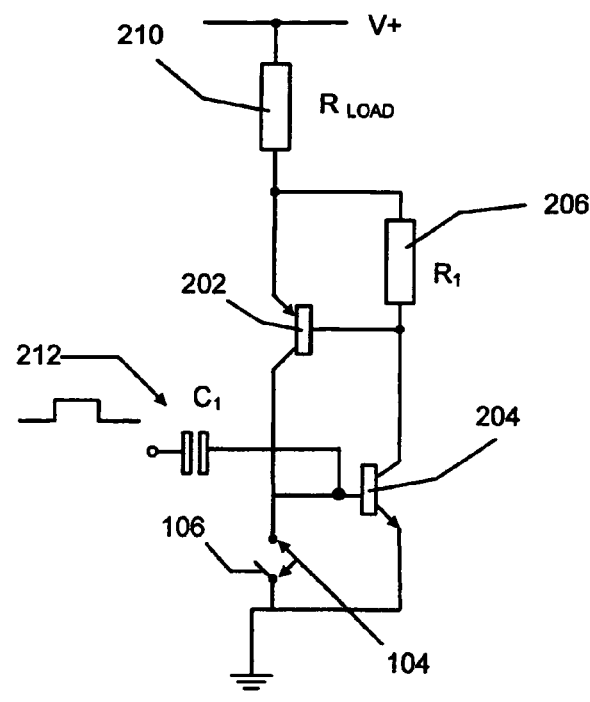
FIG. 2B illustrates a circuit diagram of a state detection device according to embodiments of the invention.

FIG. 2B illustrates another embodiment of a detection device comprising a discrete transistor latch circuit 200. In this embodiment, the latch circuit 200 employs a capacitively coupled pulse trigger 212 instead of resistor R2 208 to cause transistor 204 to become conductive once member 106 is removed. When the member 106 is removed from being electrically coupled with the contracts 104, the armed latch circuit 200 may be triggered from the first reset state into the second active or 'latched' state by an electrical pulse from the pulse trigger 212, wherein a low duty-cycle pulse is used to trigger the lower transistor 204. It should be noted that in this embodiment, there is no trickle current in the reset state due to the removal of resistor R2 208, thus reducing battery drain in the reset state. The trigger pulse may be provided by a low duty-cycle pulse from the battery state-of-charge indicator circuit of co-pending U.S. patent application Ser. No. 11/151,222, filed Jun. 14, 2005, which is incorporated in its entirety herein by reference. Such pulse may be used to ensure that the lower transistor 204 is activated after the base and the emitter are decoupled. Once triggered, the 'latched' or active second state of the circuit 200 may be used, for example, to completely discharge the battery pack.

Figure 3:
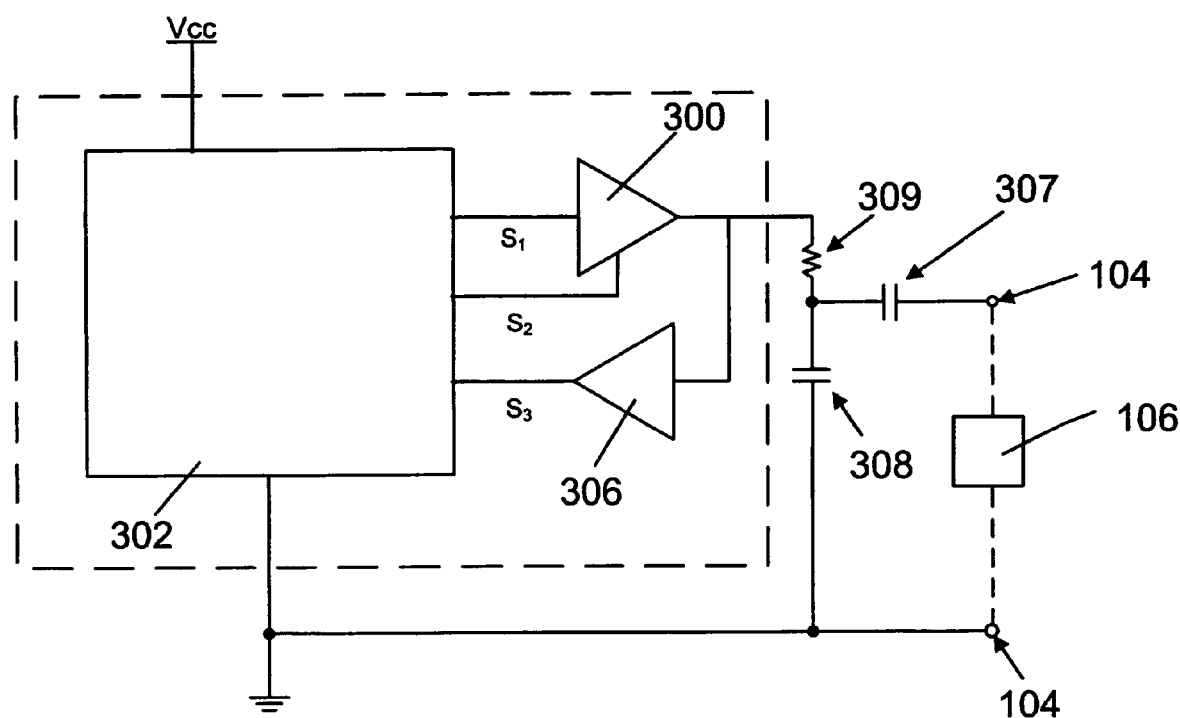
FIG. 3 illustrates a circuit diagram of a state detection device according to embodiments of the invention.

FIG. 3 illustrates such a state-of-charge indicator. As explained in more detail below, a pulse is periodically applied to tri-state CMOS logic gate 300 on line $S_1$ and then another pulse is applied on line $S_2$. Either of these pulses may be used as trigger pulse 212 in FIG. 2B.

Figure 2C:
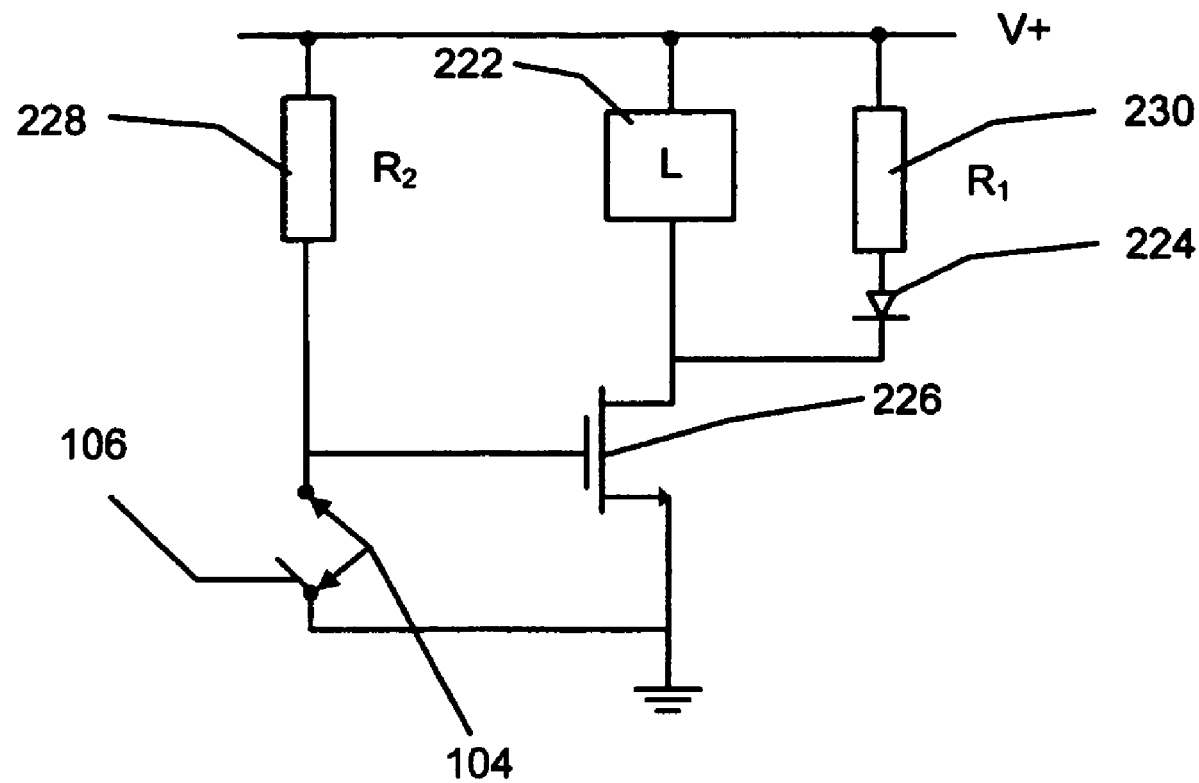
FIG. 2C illustrates a circuit diagram of a state detection device according to embodiments of the invention.

FIG. 2C illustrates an alternative embodiment of a detection device. In this embodiment, the circuit 220 may be employed for discharging a battery through a load 222. Similar to the first reset state of the circuits in FIGS. 2A & 2B, when the member 106 is coupled with the contacts 104, the transistor 226 is not conductive. When the member 106 is removed from the contacts 104, the resistor R2 228 causes transistor 226 to conduct, such that the battery discharges through the load 222, as in the second active state of the circuits in FIGS. 2A & 2B. Diode 224, which may be, for example, a light emitting diode (LED), will become active when transistor 226 conducts to indicate when the battery is discharging. Resistor R1 230 limits the input current through LED 224.

The detection of the conductance between the contacts 104 may also be implemented with the circuit of FIG. 3. A pulse or step, on line $S_1$, is applied to tri-state CMOS logic gate 300, as controlled by timing circuit 302, which pulse is applied to the RC network including resistor 309, capacitor 308 and capacitor 307 (when member 106 is electrically connected to contacts 104). The pulse on line $S_1$ has a width such that at the end of the pulse, the voltage across the RC network when contacts 104 are open can be distinguished from the voltage when contacts 104 are connected by member 106. After the pulse on line $S_1$ terminates, a pulse is applied on line $S_2$ to cause the output of logic gate 300 to be open. The voltage across the RC network, which depends on the time constant of the RC network, which, in turn depends on whether contacts 104 are connected or shorted, is read through digitizing gate 306. When the output of logic gate 300 is open, the voltage across the capacitor 308 appears on the input of the gate 306 since no current is flowing through resistor 309 and is read through digitizing gate 306. Gate 306 produces one logic level when its input is below a threshold and a second logic level when its input is over a threshold, indicating the state of connection between contacts 104.

In various embodiments, a one-time operating state detection device is provided for selectively operating a battery management function based on a change in the capacitive coupling between electrical contacts. The detection device may comprise, for example, a one-time removable member that is capacitively coupled to the contacts. A detector may then detect a change in the capacitance between the contacts in response to the decoupling of the member from the contacts. In response to a detection of a change in the capacitance, which may be, for example, indicated by a change in the RC time constant associated with circuitry connected between the contacts, the detector may selectively operate a battery management function. As described above, the battery management function may be, for example, a battery discharge operation or a state-of-charge indication. Alternatively, the battery management function may comprise a plurality of such functions.

Referring again to FIG. 1, a one-time operating member for forming a capacitive bridge between electrical contacts may be included in a detection device 100 comprising a printed circuit board 102 including electrical contacts 104. The printed circuit board 102 may be integrated into a battery casing. Alternatively, the printed circuit board 102 may be housed separately from the battery casing. As in the conductive coupling embodiments, the electrical contacts 104 may be located on a front side of the printed circuit board 102 with mounted components, or alternatively may be located on a back side of the printed circuit board 102 without mounted components so that additional printed circuit board area is not required.

In one embodiment, the member 106 may comprise a removable tape comprising a capacitive layer 108, wherein the capacitive layer 108 forms a portion of the member surface area. The removable member 106 may comprise a flexible tape or ribbon, which may be formed from a suitable material such as mylar, kapton or the like and the member 106 may be coupled to the printed circuit board 102 so that the capacitive layer 108 forms a capacitive bridge between the electrical contacts 104. Alternatively, the capacitive layer 108 may comprise the entire surface area of the member 106. For example, the capacitive layer 108 may comprise a metallic strip insulated from conductive contact with the electrical contacts 104. The removable member 106 and capacitive layer 108 may be coupled to the electrical contacts 104 using a dielectric, such as an insulative adhesive, or any other surface mount assembly technique that is suitable to form the capacitive bridge between the contacts 104.

The remainder of the removable member 106 is configured to fold back over the portion of the member 106 that contains the capacitive layer 108, as illustrated in FIG. 1. Removing the folded portion of the member 106 in the indicated direction causes the portion of the member 106 that contains the capacitive layer 108 to decouple from the printed circuit board 102, removing the capacitive bridge between the electrical contacts 104.

In one embodiment, the printed circuit board 102 comprises a detector which may, for example, be an electronic circuit for detecting a capacitive coupling between the electrical contacts 104 and for selectively operating a battery management function based on a detected change in the capacitive coupling from a first operating state to a second operating state. One such example is the impedance detection device of co-pending U.S. patent application Ser. No. 11/151,222 as shown in FIG. 3.

Referring back to the circuit illustrated in FIG. 3, the time constant of the RC network when the member 106 capacitively couples contacts 104 is different from the time constant when member 106 is removed from contacts 106. For example, a shorter and faster RC time constant may indicate that the member 106 has been decoupled from the contacts 104. The width of the pulse on line $S_1$ can be selected so that gate 306 will produce one logic level when its input is below a threshold and a second logic level when its input is over a threshold, wherein each of the two logic levels from gate 306 indicate one of the operating states of the state detection device (i.e., normal or discharge). In one embodiment, the detector may be adapted to selectively operate a battery management function circuit, such as a complete discharge device or a state-of-charge indicator as in co-pending U.S. patent application Ser. No. 11/151,222 based on the logic level of gate 306. Discrete or integrated logic circuits may be used to selectively operate, directly or indirectly, additional battery management functions such as monitoring battery state-of-charge or switching between operating modes based at least in part on the logic level of gate 306. For example, the detection may be used to control the conductivity of transistor 204 in FIG. 2A or 2B or transistor 226 in FIG. 2C without the direct connection of these transistors to contacts 104.

Therefore, the embodiments described herein provide for detecting a change in an electrical property between contacts. Particularly, the embodiments provide for a detection device which includes a one-time removable member for electrically coupling contacts and a detector for detecting a change in the coupling between the contacts when the member is removed.

Although the invention has been described in terms of various embodiments, it is not limited thereto. Rather, the appended claims should be construed broadly to include other variants and embodiments of the invention which may be made by those skilled in the art without departing from the scope and range of equivalents of the invention.

What is claimed is:

1. A one-time operating state detection device comprising:
a pair of contacts;
a member electrically coupling said pair of contacts, said member adapted to be only once removable from said contacts, the member being bonded to the pair of contacts by a bond, wherein the bond is in a first state when the member electrically couples the pair of contacts and in a second state when the member is removed from the contacts, wherein when the bond is in the second state the bond is physically configured such that the member cannot be reattached to the pair of contacts; and
a detector, wherein said detector detects a change in the coupling between said pair of contacts when said member is removed.

2. The detection device of claim 1, wherein said member conductively couples said pair of contacts.

3. The detection device of claim 2, wherein said member includes a conductive member removably connected to said contacts.

4. The detection device of claim 1, wherein said member capacitively couples said pair of contacts.

5. The detection device of claim 4, wherein said member includes a conductive member removably spaced from at least one of said contacts by a dielectric.

6. The detection device of claim 1, wherein said detector selectively operates a battery management function.

7. The detection device claim 6, wherein said battery management function comprises a battery discharge operation.

8. The detection device of claim 6, wherein said battery management function comprises a state of charge indication.

9. The detection device of claim 1, wherein said detector comprises a latch circuit, said latch circuit being maintained in a first state prior to removal of said member, and said change in the coupling enabling said latch circuit to change to a second state.

10. The detection device of claim 9, wherein said change to a second state is triggered by a current.

11. The detection device of claim 9, wherein said change to a second state is triggered by an electrical current pulse.

12. The detection device of claim 9, wherein said change to a second state is triggered by a battery management circuit.

13. The detection device of claim 12, wherein said battery management circuit comprises a battery state-of-charge indicator.

14. The detection device of claim 1, wherein said detector measures a change in an RC time constant associated with said coupling.

15. The detection device of claim 14, wherein said measuring comprises using an electrical current pulse.

16. The detection device of claim 14, wherein said measuring is triggered by a battery management circuit.

17. The detection device of claim 16, wherein said battery management circuit commmprises a battery state of charge indicator.

18. The detection device of claim 1, wherein said member includes a removable tape.

19. A method of detecting a change in operating state, comprising:
electrically coupling a pair of contacts using a member, said member adapted to be only once removable from said pair of contacts, wherein the member is not capable of being reattached to said contacts; and detecting a change in the coupling between said pair of contacts when said member is removed.

20. The method of claim 19, wherein said coupling includes conductively coupling said pair of contacts using said member.

21. The method of claim 19, wherein said coupling includes capacitively coupling said pair of contacts using said member.

22. The method of claim 19, further comprising selectively operating a battery management function in response to said detecting of a change in the coupling.

23. The method of claim 22, wherein said battery management function comprises a battery discharge operation.

24. The method of claim 22, wherein said battery management function comprises a battery state of charge indication.

25. The method of claim 19, wherein said detecting of a change in the coupling comprises:
   maintaining a first state prior to said removal of said member, and
   enabling a change from said first state to a second state in response to said change in the coupling.

26. The method of claim 25, further comprising triggering said change to a second state with a current.

27. The method of claim 25, further comprising triggering said change to a second state with an electrical current pulse.

28. The method of claim 25, further comprising triggering said change to a second state with a battery management circuit.

29. The method of claim 28, wherein said battery management circuit comprises a battery state-of-charge indicator.

30. The method of claim 19 wherein said detecting of a change in the coupling comprises measuring a change in an RC time constant associated with said coupling.

31. The method of claim 30, wherein said measuring comprises using an electrical pulse.

32. The method of claim 30, further comprising triggering said measuring with battery management circuit.

33. The method of claim 32, wherein said battery management circuit comprises a battery state-of-change indicator.

* * * * *